(12) United States Patent
Liu et al.

(10) Patent No.: US 8,624,351 B2
(45) Date of Patent: Jan. 7, 2014

(54) PACKAGE STRUCTURE AND METHOD FOR MAKING THE SAME

(75) Inventors: Chien-Hung Liu, New Taipei (TW); Shu-Ming Chang, New Taipei (TW)

(73) Assignee: Xintec, Inc., Jhongli (TW)

( * ) Notice: Subject to any disclaimer, the term of this patent is extended or adjusted under 35 U.S.C. 154(b) by 174 days.

(21) Appl. No.: 13/117,151

(22) Filed: May 27, 2011

(65) Prior Publication Data
US 2011/0291228 A1    Dec. 1, 2011

Related U.S. Application Data

(60) Provisional application No. 61/348,749, filed on May 27, 2010.

(51) Int. Cl.
*H01L 29/02*    (2006.01)
*H01L 21/78*    (2006.01)

(52) U.S. Cl.
USPC .... 257/528; 257/737; 257/738; 257/E29.002; 257/E21.599; 438/460; 438/462; 438/329; 438/613

(58) Field of Classification Search
USPC .......... 257/528, 737, 738, E29.002, E21.599; 438/460, 329, 613, 462
See application file for complete search history.

(56) References Cited

U.S. PATENT DOCUMENTS 6,972,964 B2 * 12/2005 Ho et al. ................. 361/761

* cited by examiner

*Primary Examiner* — Thinh T Nguyen
(74) *Attorney, Agent, or Firm* — Liu & Liu

(57) ABSTRACT

A package structure which includes a non-conductive substrate, a conductive element, a passivation, a jointed side, a conductive layer, a solder and a solder mask is disclosed. The conductive element is disposed on a surface of the non-conductive substrate and consists of a passive element and a corresponding circuit. The passivation completely covers the conductive element and the non-conductive substrate so that the conductive element is sandwiched between the passivation and the non-conductive substrate. The conductive layer covers the jointed side which exposes part of the corresponding circuit, extends beyond the jointed side and is electrically connected to the corresponding circuit. The solder mask which completely covers the jointed side and the conductive layer selectively exposes the solder which is disposed outside the jointed side and electrically connected to the conductive layer.

19 Claims, 19 Drawing Sheets

PACKAGE STRUCTURE AND METHOD FOR MAKING THE SAME

CROSS REFERENCE TO RELATED APPLICATIONS

This application claims the benefit of U.S. Provisional application Ser. No. 61/348,749, filed May 27, 2010.

BACKGROUND OF THE INVENTION

1. Field of the Invention

The present invention generally relates to a package structure for use in an integrated passive device (IPD) and a method for forming a package structure. In particular, the present invention is directed to a package structure with a conductive element substantially consisting of a passive element and of a corresponding circuit on a non-conductive substrate and a method for forming the package structure.

2. Description of the Prior Art

The purpose of an integrated passive device (IPD) resides in combining multiple passive elements on a substrate to provide an integrated device module of a specific function. FIGS. 1 to 4 illustrate a current method for forming a package structure including electronic elements. Please refer to FIG. 1, which discloses a multilayer structure 101 with composite material layers. Such multilayer structure 101 with composite material layers includes a conductive substrate 110, a corresponding circuit 121, an electronic element 122, a resin material 130 and a transparent layer 140. The conductive substrate 110 which is illustrated here is a semi-conductive substrate such as Si. The electronic element 122 may be a photosensor, and the electronic element 122 and the corresponding circuit 121 are electrically connected to each other and together disposed on the conductive substrate 110. The resin material 130 covers the corresponding circuit 121 and the electronic element 122. The resin material 130 may be an epoxy resin. There is an additional transparent layer 140, such as glass, on the resin material 130 to allow the photosensor to pick up optical signals.

Second, as shown in FIG. 2, first the conductive substrate 110 is polished to reduce its thickness, then an etching step is carried out to define the scrub lines 150 on the conductive substrate 110. Later, as shown in FIG. 3, a combining material (not shown) is applied to combine the structure 101 which now has the defined scrub lines 150 with a carrier 160 of a glass-type material to be later mechanically processed to form a notch 151 which corresponds to the scrub lines 150, in order to expose the corresponding circuit 121 which is electrically connected to the electronic element 122. Next, the patterned conductive layer 123 which covers the carrier 160 and the conductive substrate 110 as well as a corresponding solder 124 which is disposed on the conductive layer 123 are formed. The conductive layer 123 makes the corresponding solder 124 indirectly electrically connected to the corresponding circuit 121 because of covering the notch 151 and being electrically connected to the corresponding circuit 121.

Afterwards, please refer to FIG. 4, solder balls 125 are formed on the solder 124 to serve as the outward electrical conductive media of the corresponding circuit 121 in the multilayer structure 101. After the completion, the entire multilayer structure 101 can be processed and diced mechanically through the scrub lines 150 to get multiple electronic products in single piece.

SUMMARY OF THE INVENTION

The examples of the present invention propose a package structure which is different from the traditional package structure with electronic devices. The package structure of the present invention includes a non-conductive substrate, a conductive element, a passivation layer, a jointed side, a conductive layer, a solder and a solder mask. The conductive element is disposed on a surface of the non-conductive substrate and substantially consists of a passive element and a corresponding circuit. The passivation layer completely covers the conductive element and the non-conductive substrate so that the conductive element is sandwiched between the passivation layer and the non-conductive substrate. The jointed side exposes part of the corresponding circuit so that the conductive layer which covers the jointed side extends beyond the jointed side to be electrically connected to the corresponding circuit. The solder is disposed outside the jointed side and directly electrically connected to the conductive layer. The solder mask which fills up the jointed side completely covers the conductive layer and selectively exposes the solder.

Another example of the present invention proposes a method for forming a package structure. First, a multilayer structure is provided. The multilayer structure includes a non-conductive substrate and a passivation layer so that a conductive element is sandwiched between the non-conductive substrate and the passivation layer. The conductive element is disposed on a surface of the non-conductive substrate and substantially consists of a passive element and a corresponding circuit. Second, a notch is formed so that the bottom of the notch exposes at least one of and part of the passive element and the corresponding circuit. Then a conductive layer is formed to cover the notch, to electrically connect at least one of the passive element and the corresponding circuit and to extend beyond the notch. Next, a solder mask is formed to completely fill up the notch and to selectively expose the conductive layer. Later, a solder which is disposed outside the notch is formed to directly electrically connect to the exposed conductive layer.

In the method for forming a package structure of the present invention, in one aspect the non-conductive substrate may completely cover the passivation layer without contacting the conductive element. In another aspect, the notch may exhibit various embodiments. For example, the notch has a tapered sidewall or a vertical sidewall. Further, the notch may penetrate or further enter the multilayer structure from the non-conductive substrate. In the meantime, the notch may merely penetrate the non-conductive substrate and render the passive element exposed. Moreover, the bottom of the notch may enter the passivation layer. Or the notch may further enter part of the non-conductive substrate in addition to penetrating the non-conductive substrate and the passivation layer.

In still another aspect, the notch may go deeper into the multilayer structure from a non-conductive carrier side. On one hand, the notch may merely penetrate the non-conductive carrier. On the other hand, the notch may further enter the passivation layer in addition to penetrating the non-conductive carrier. Alternatively, the notch may further penetrate the passivation layer of the multilayer structure. The package structure after the method of the present invention the conductive element is always disposed on a surface of the non-conductive substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
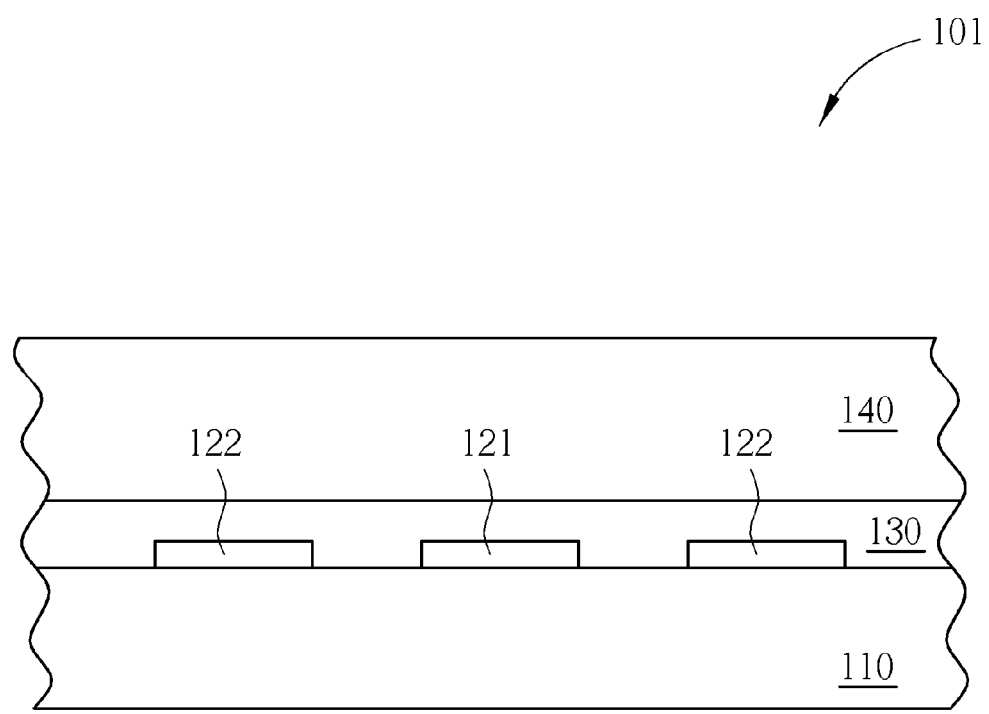
FIGS. 1 to 4 illustrate a current method for forming a package structure including electronic elements.
Figure 2:
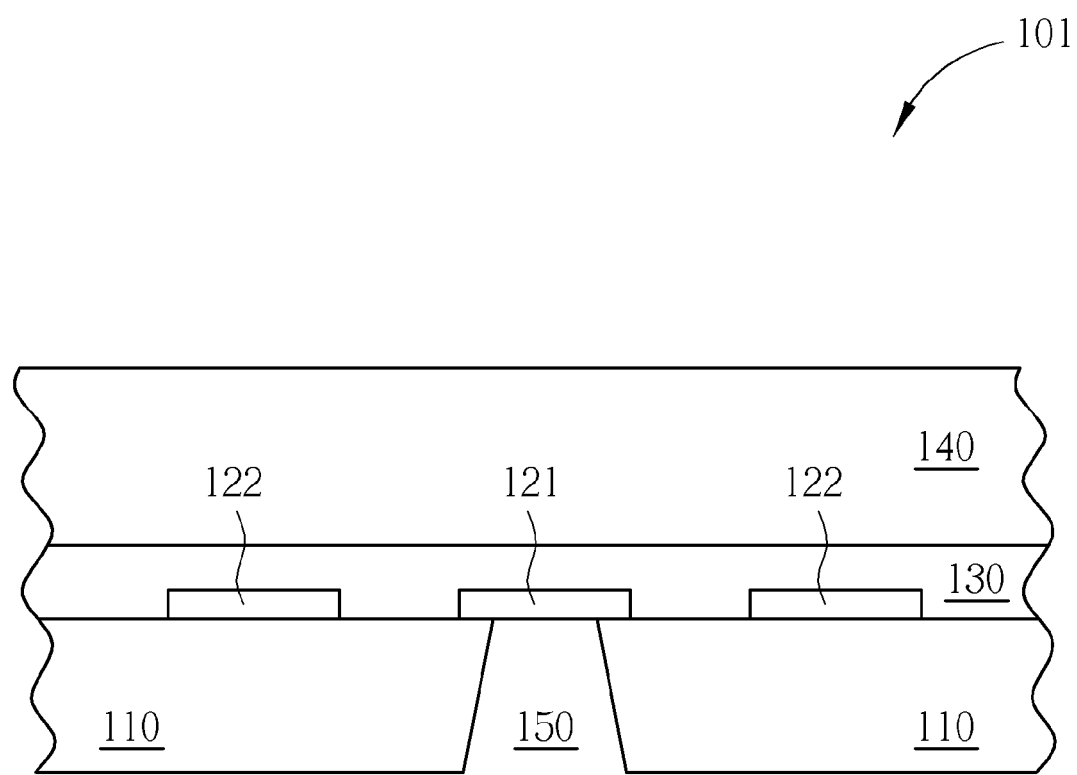
Figure 3:
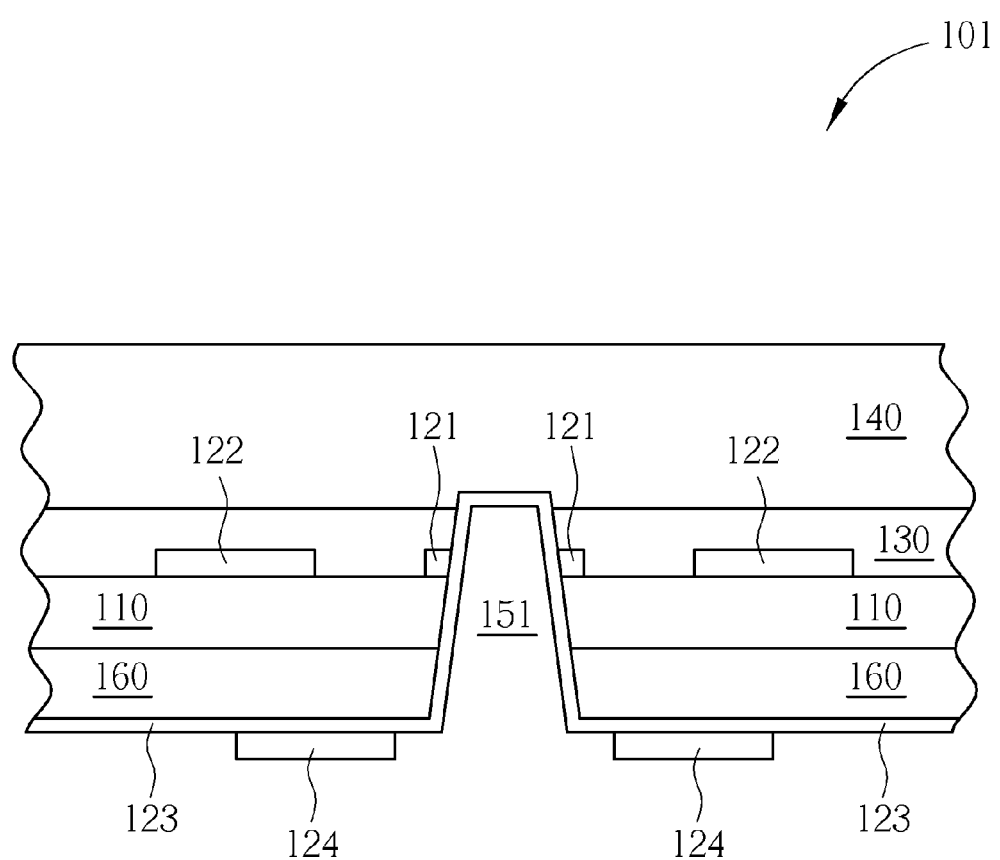
Figure 4:
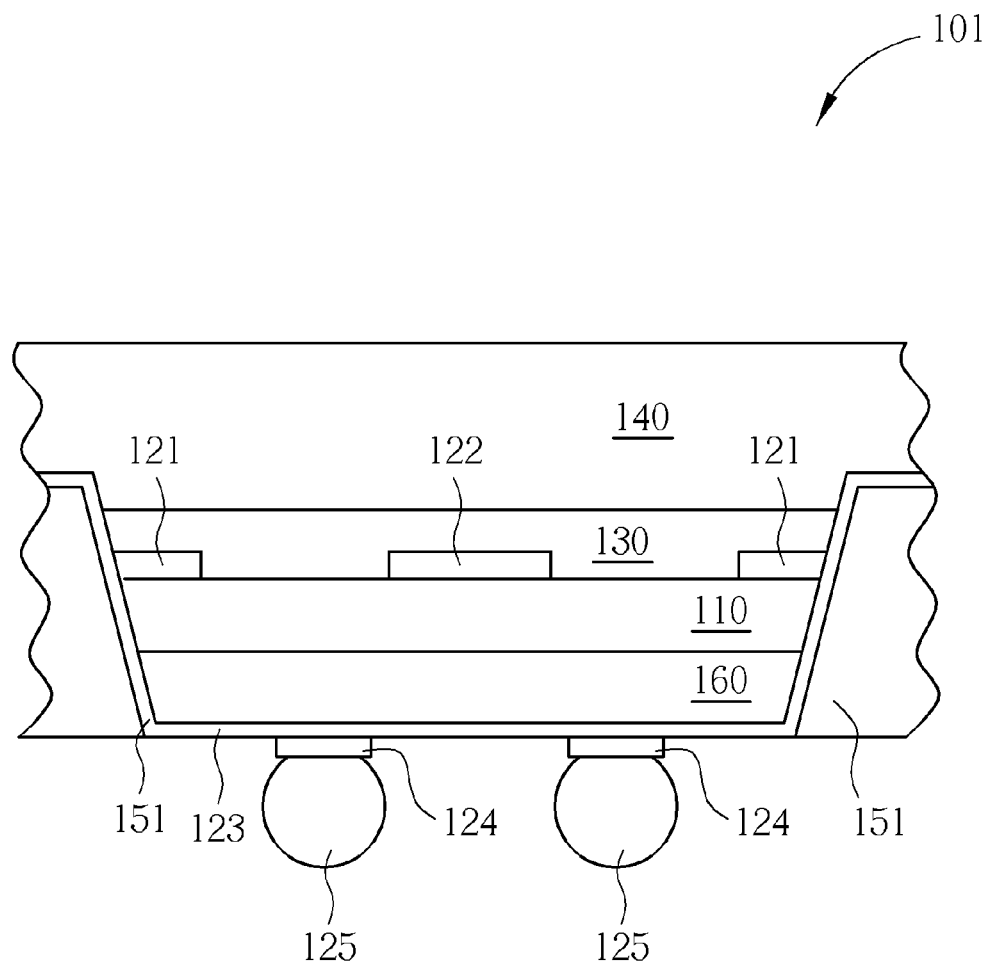
Figure 5:
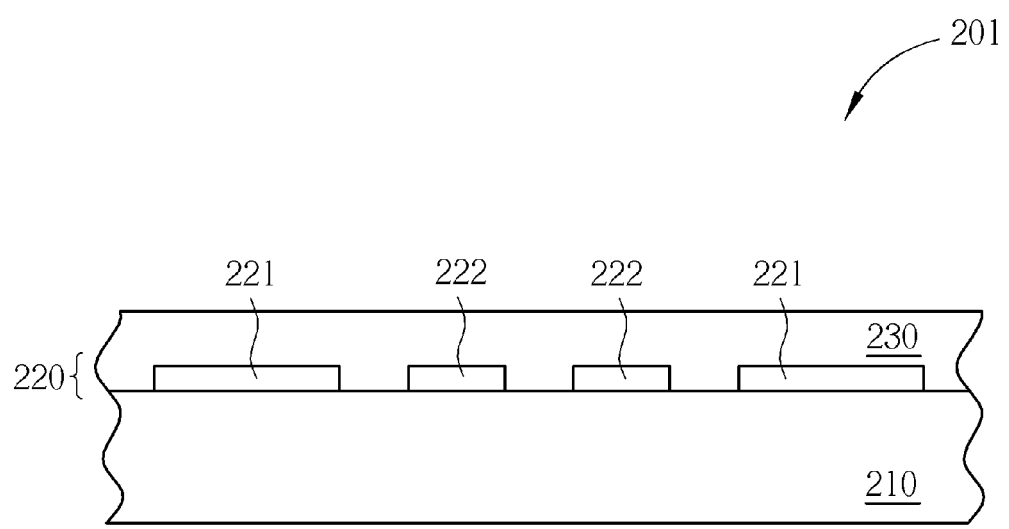
FIGS. 5-10 illustrate the method for forming a package structure, various embodiments as well as modifications of the present invention.

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package an integrated passive device. However, embodiments of the invention are not limited thereto. For example, the chip package of the embodiments of the invention may be applied to a sensor chip, active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits One example of the present invention demonstrates a method for forming a package structure in order to obtain a package structure. First, the method will be explained and various embodiments as well as modifications will be elaborated on. FIGS. 5-10 illustrate the method for forming a package structure, various embodiments as well as modifications of the present invention. Firstly, please refer to FIG. 5, a multilayer structure 201 is provided. The multilayer structure 201 includes at least a non-conductive substrate 210 and a passivation layer 230. In addition, the multilayer structure 201 further includes a conductive element 220. The conductive element 220 in the multilayer structure 201 is disposed on a surface of non-conductive substrate 210 so the conductive element 220 is sandwiched between the non-conductive substrate 210 and the passivation layer 230.

The non-conductive substrate 210 may be a transparent substrate, for example an insulting substrate such as glass, or an opaque substrate such as a ceramic substrate. The thickness of the non-conductive substrate 210 may be about 300 µm-50 µm. The passivation layer 230 is also a non-conductive material, such as silicon nitride, silicon oxide, epoxy resin or polyimide, to protect the conductive element 220 and from the damages of the environment to the conductive element 220. The conductive element 220 of the present invention substantially consists of a passive element 222, such as an electric resistance, a capacitor and an inductance, as well as a corresponding circuit 221 which is electrically connected to the passive element 222 and the conductive element 220 is free of any active element.

Figure 6:
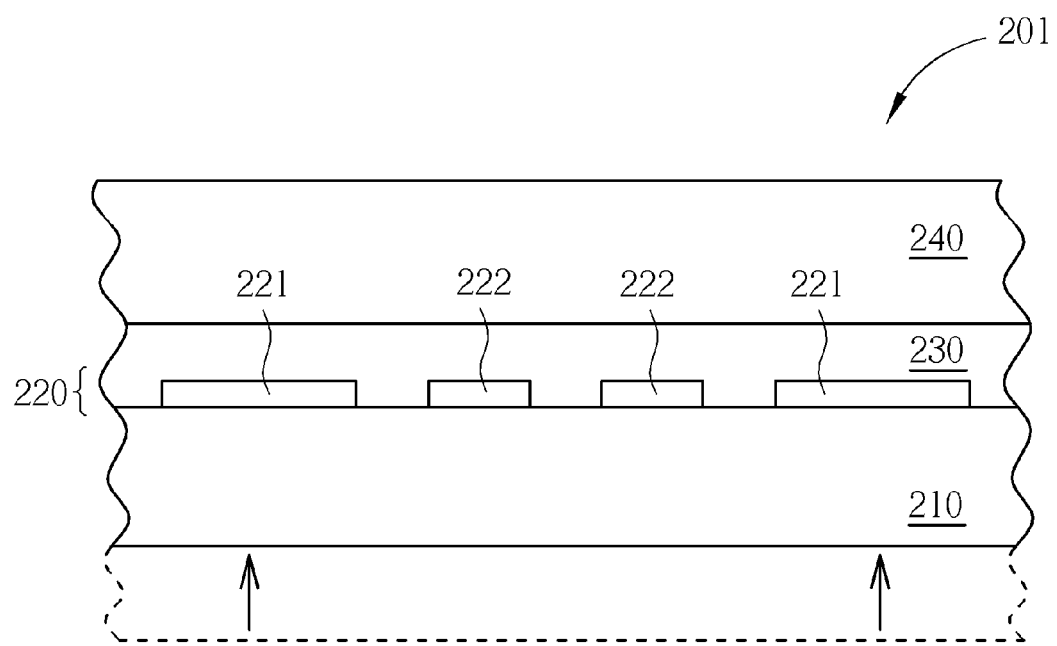

Second, please refer to FIG. 6, a non-conductive carrier 240 is provided and a combining material (not shown) is used so that the non-conductive carrier 240 completely covers the passivation layer 230 and combines with it. Due to the isolation and segregation of the passivation layer 230, the non-conductive carrier 240 does not contact the conductive element 220. The non-conductive carrier 240 may include at least one of ceramic and glass. The thickness of the non-conductive carrier 240 may usually be greater than about 300 µm. The non-conductive carrier 240 and the non-conductive substrate 210 usually respectively represent the two opposite surfaces of the multilayer structure 201. Besides, optionally the thickness of the non-conductive substrate 210 may be suitably reduced to about 20 µm-70 µm for example, by polishing.

Then, a notch is formed in the multilayer structure 201 and to make the bottom of the notch expose part of the corresponding circuit 221. Part of the multilayer structure 201 may be removed by at least one of an etching procedure or a mechanical dicing procedure from the non-conductive carrier 240 side or from the non-conductive substrate 210 side to respectively obtain the needed notches. In accordance with different embodiments, such as different depth or different shapes of the notches, there are various examples of the notches in the present invention to have a vertical sidewall or a tapered sidewall. Different embodiments are given as follows to elaborate the present invention.

First Embodiment

Figure 7A:
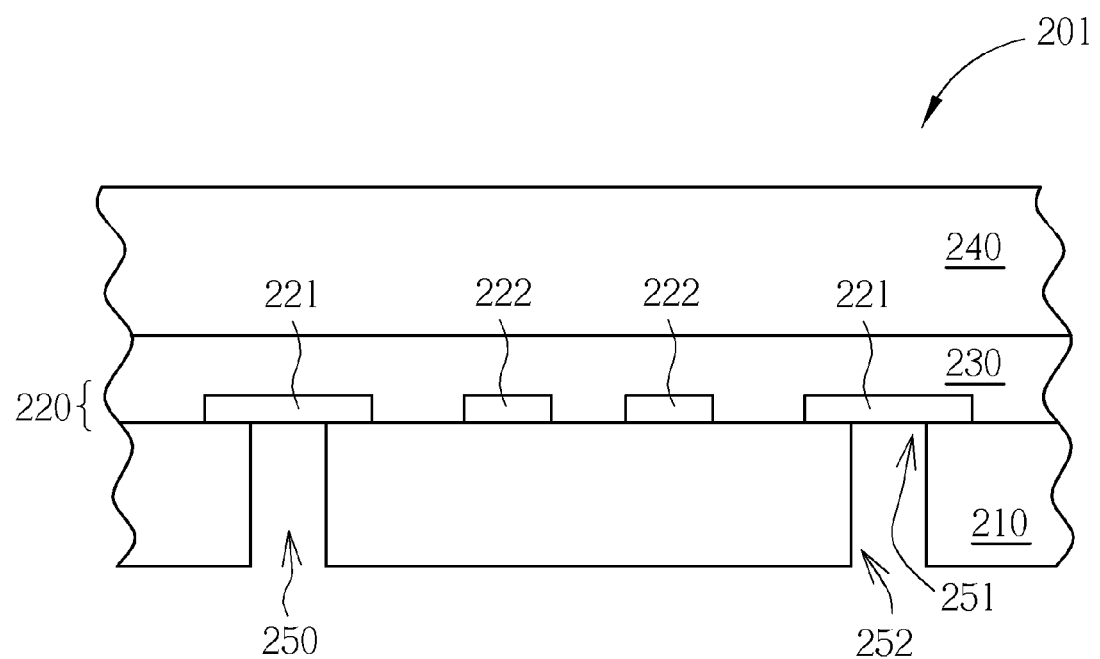

Please refer to FIG. 7A, illustrating to remove some of the multilayer structure 201 from the non-conductive substrate 210 side and to form the notch 250. The notch 250 has a substantially vertical sidewall 252, for example the notch 250 includes a notch bottom 251 and a notch sidewall 252. In this embodiment, the consequently formed notch 250 may merely penetrate the non-conductive substrate 210 upwards and makes the passive element 222 or the corresponding circuit 221 exposed. For example, if the thickness of the non-conductive substrate 210 is about 50 µm, the depth of the notch 250 is also around 50 µm so that the notch 250 does not substantially enter the passivation layer 230.

Figure 8:
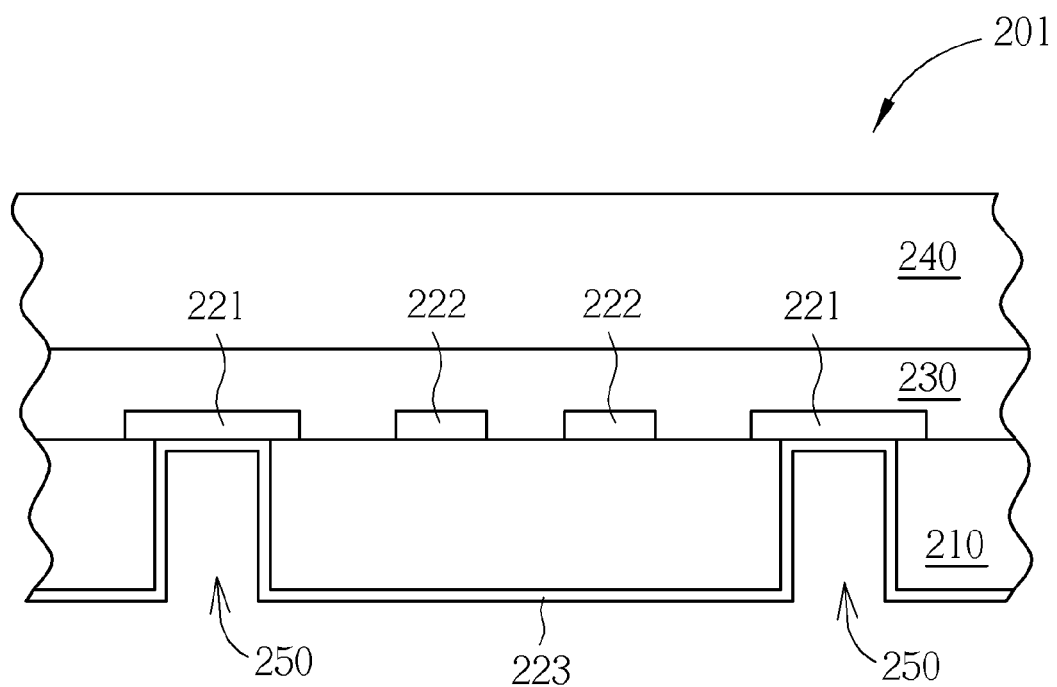

Later, as shown in FIG. 8, a conductive layer 223 is formed on one side of the non-conductive substrate 210 with the notch 250. In one aspect, the conductive layer 223 covers the non-conductive substrate 210 and the notch 250, and simultaneously is electrically connected to the corresponding circuit 221. In another aspect, the conductive layer 223 extends outwards and beyond the notch 250. The conductive layer 223 may be formed by deposition totally. The electric connection between the conductive layer 223 and the corresponding circuit 221 form a T section. The conductive layer 223 is usually a metal, such as Cu or Al.

Figure 9:
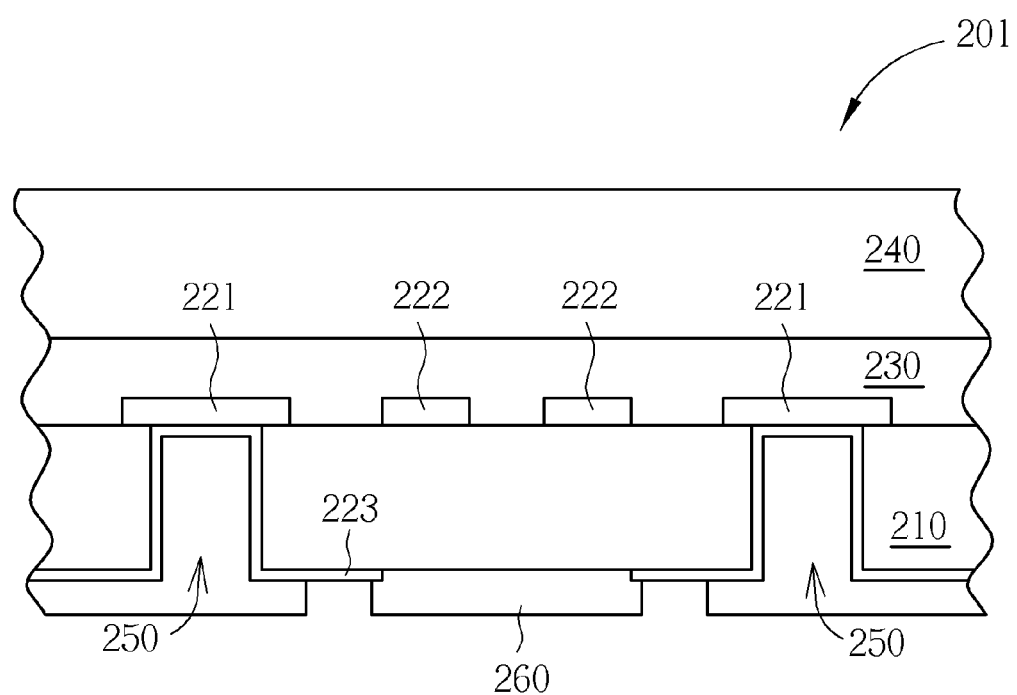

Next, as shown in FIG. 9, an insulting layer, such as a solder mask 260 is formed on the bottom of the non-conductive substrate 210. Apart from completely filling up the notch 250, the solder mask 260 also selectively exposes the conductive layer 223 to leave some places for solders (not shown). Preferably, before the solder mask 260 is formed, the conductive layer 223 may be patterned in advance so that the conductive layer 223 which electrically connects different passive elements 222 may not mutually connect with one another to avoid shorting of passive elements 222.

Figure 10:
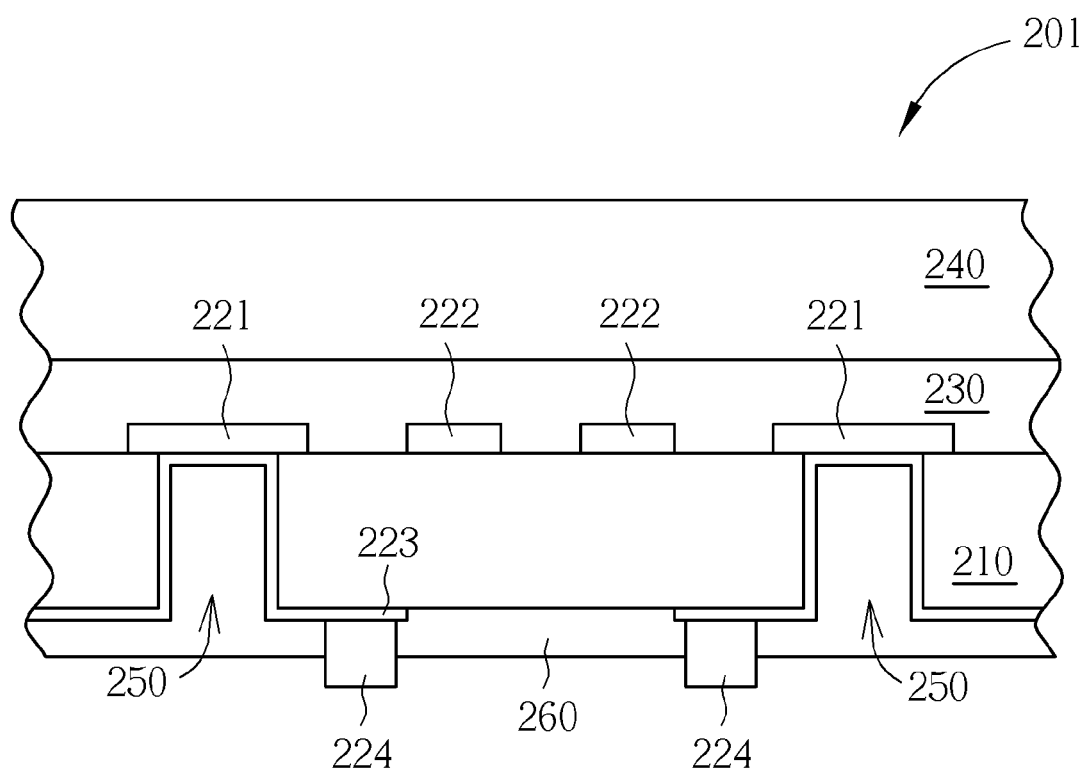
Figure 11A:
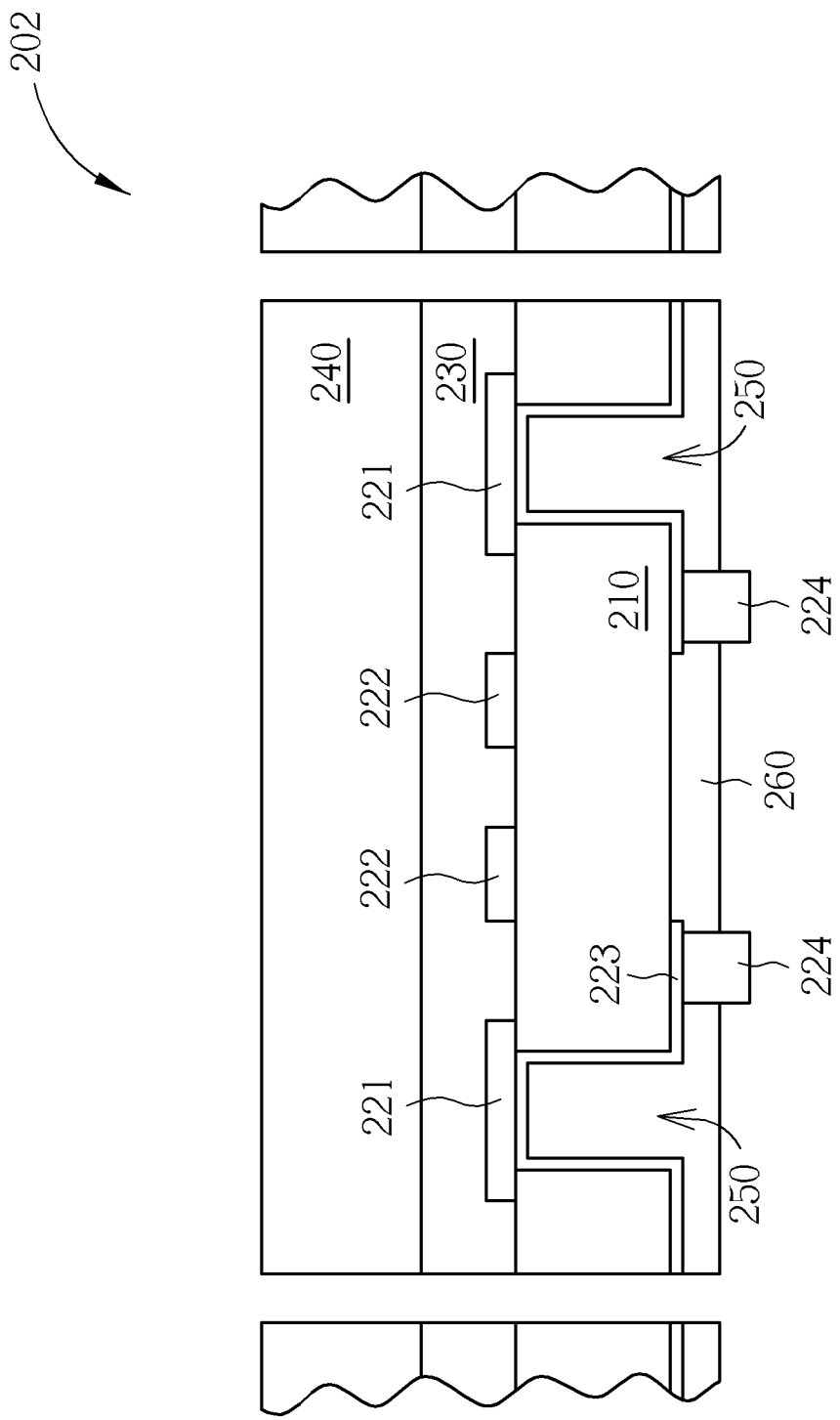
FIGS. 11A, 11B, 11C 11D and 11E each illustrates the results of the above-mentioned first embodiment, second embodiment, third embodiment, fourth embodiment and fifth embodiment after the dicing procedure is completed.
Figure 11B:
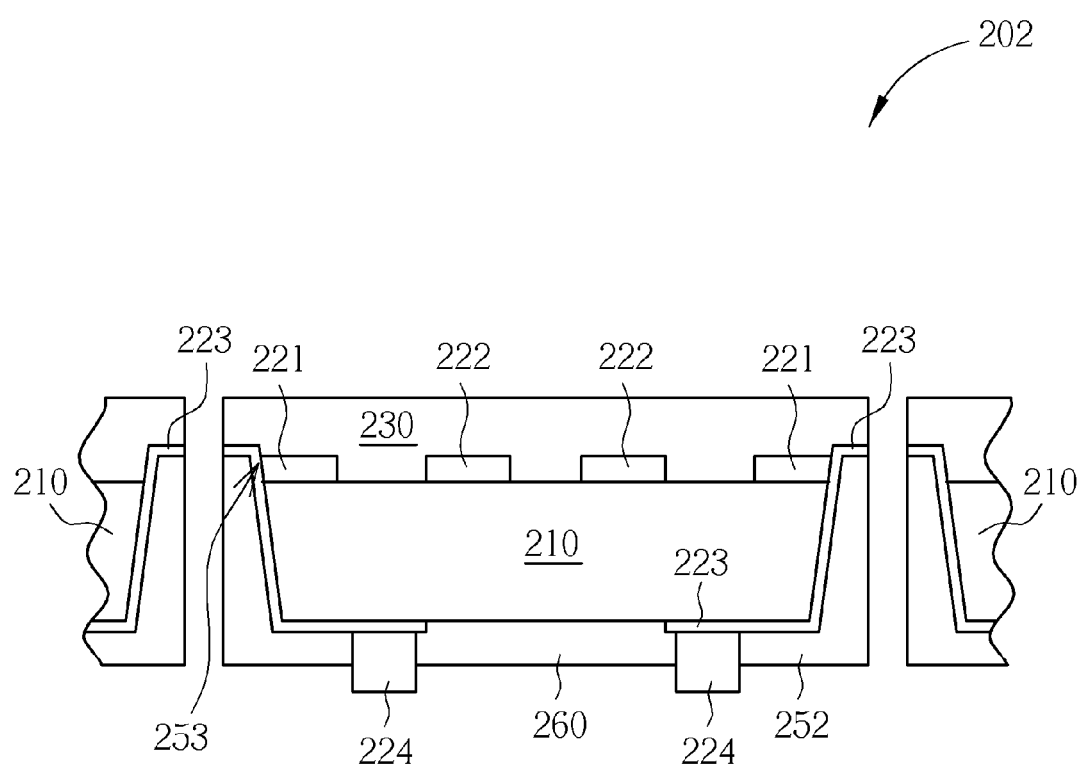
Figure 11C:
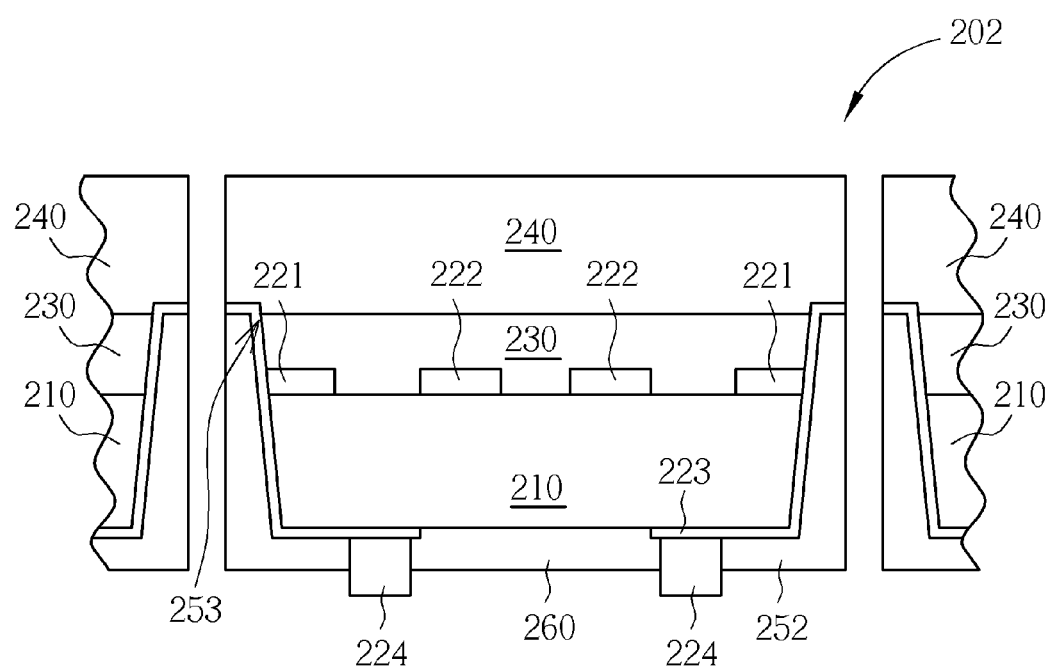
Figure 11D:
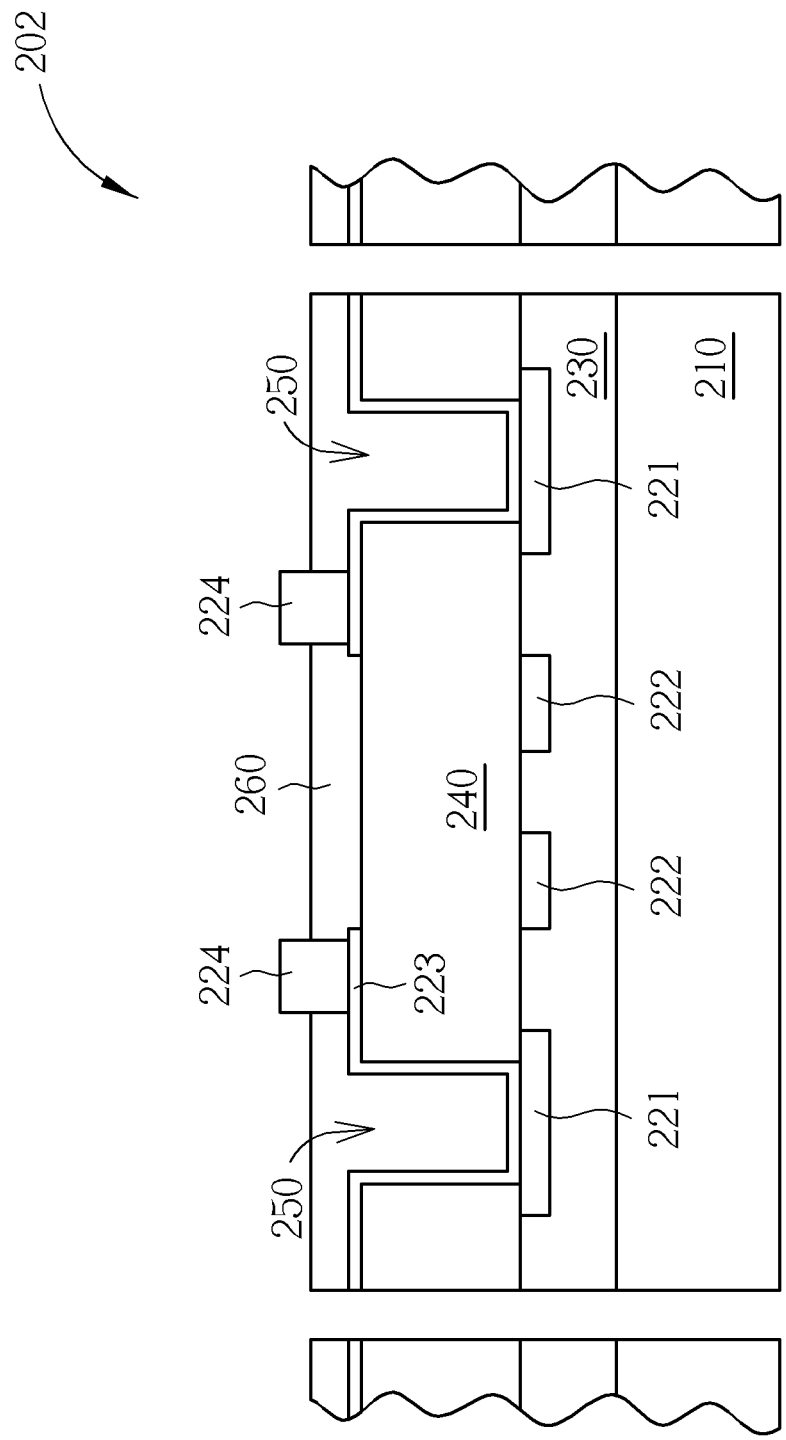
Figure 11E:
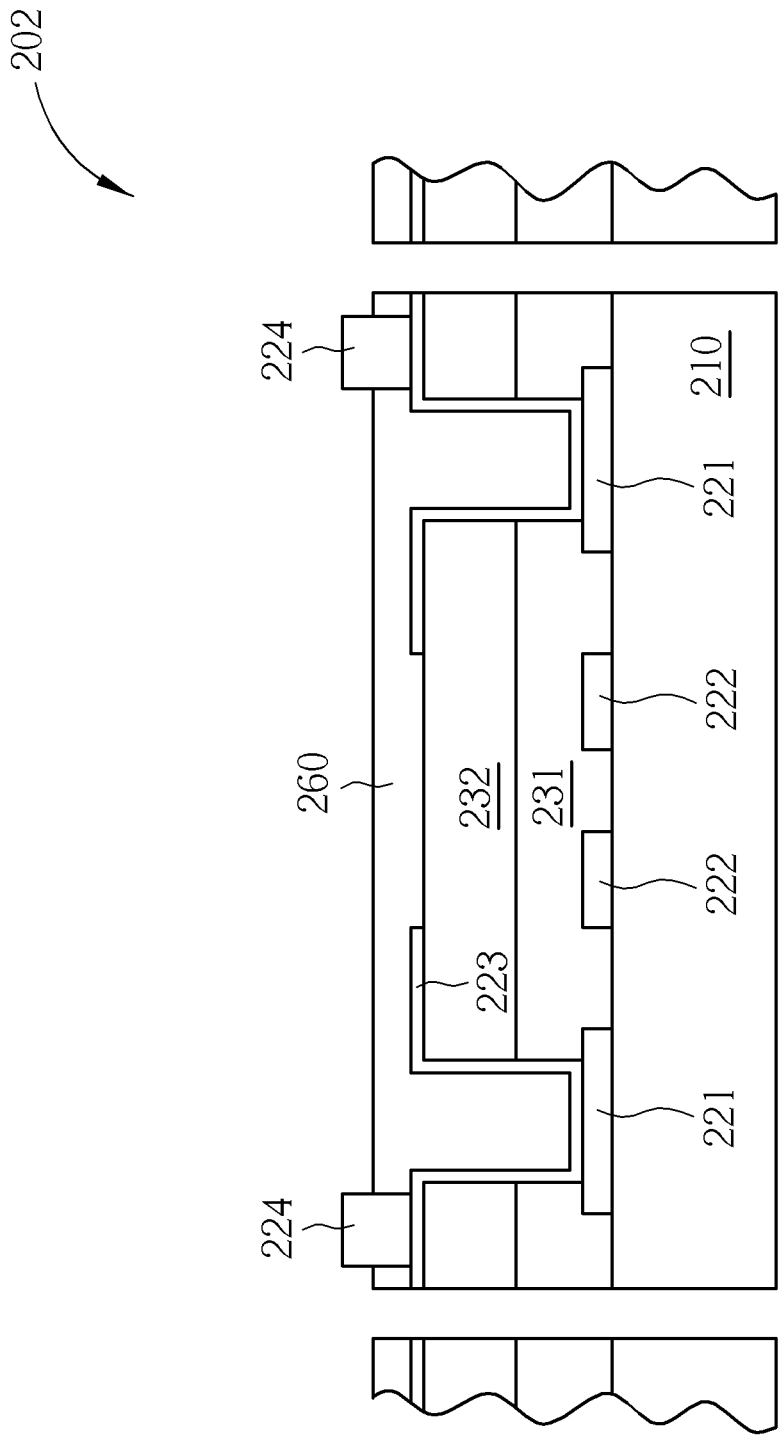

Later, please refer to FIG. 10, a solder 224 is formed on the exposed conductive layer 223 conventionally. The location of the solder 224 is always outside the notch 250 and directly electrically connected to the exposed conductive layer 223. By means of the conductive layer 223, the solder 224 serves as the media which electrically connects the corresponding circuit 221 in the multilayer structure 201 outwards. The solder 224 is usually a conductive material, such as metal.

Second Embodiment

Figure 7B:
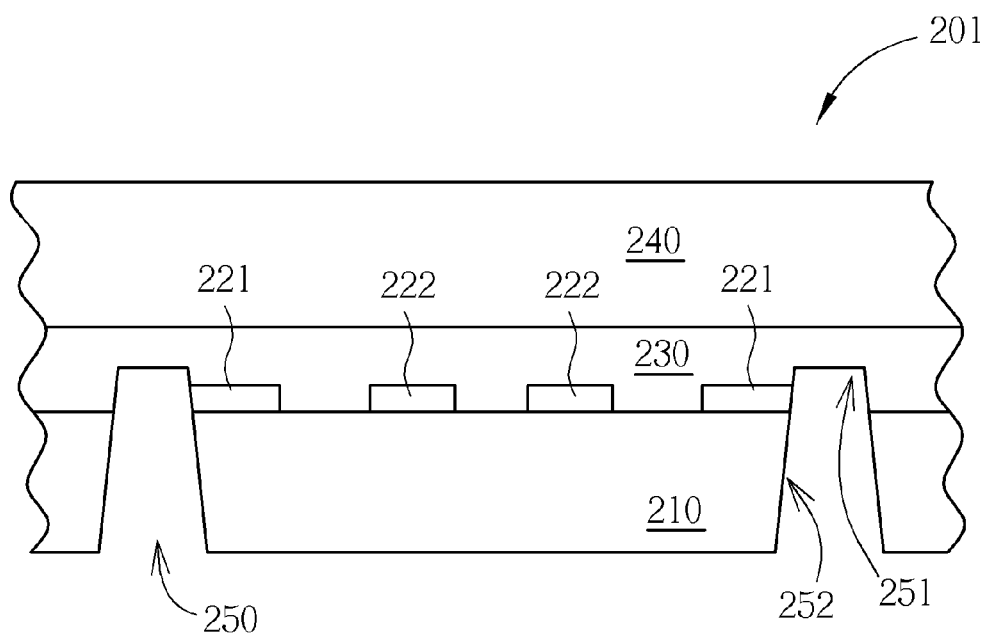

Please refer to FIG. 7B, illustrating another example to remove some of the multilayer structure 201 from the non-conductive substrate 210 side and to form the notch 250. The notch 250 has a tapered sidewall 252, for example the notch 250 includes a bottom 251 and a tapered sidewall 252. In this second embodiment, the consequently formed notch 250 not only penetrates the non-conductive substrate 210 upwards and makes the passive element 222 or the corresponding circuit 221 exposed, but also further enters the passivation layer 230. Please refer to the first embodiment for the other steps of the second embodiment to form the conductive layer, the solder mask and the solder.

Third Embodiment

Figure 7C:
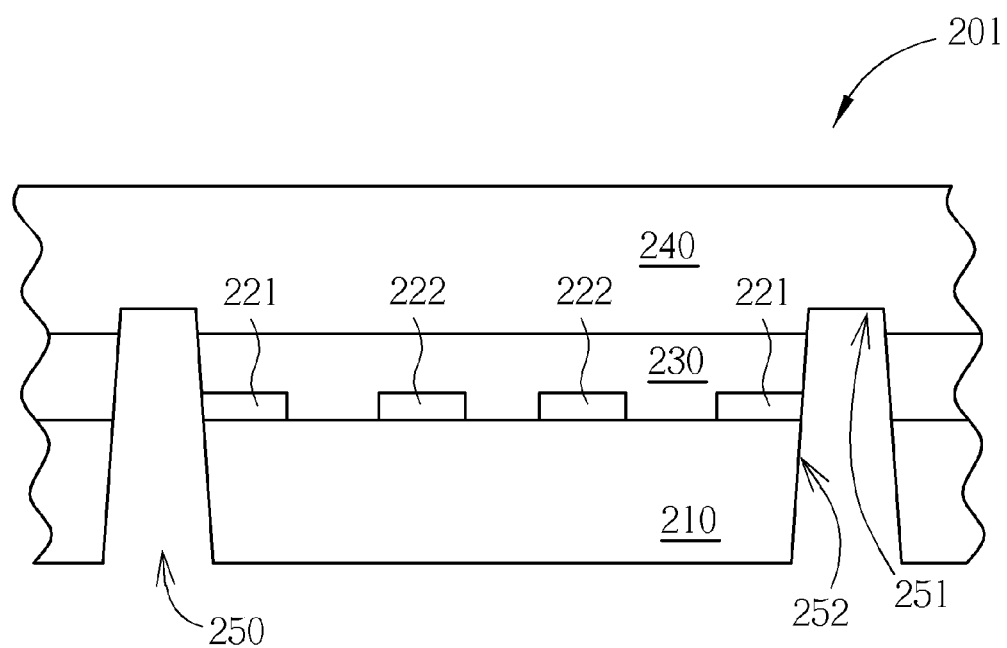

Please refer to FIG. 7C, illustrating another example to remove some of the multilayer structure 201 from the non-conductive substrate 210 side and to form the notch 250. The notch 250 has a tapered sidewall 252, for example the notch 250 includes a bottom 251 and a tapered sidewall 252. In this third embodiment, the notch 250 which starts upwards from the bottom of the non-conductive substrate 210 not only penetrates the non-conductive substrate 210 and the passivation layer 230, to make the passive element 222 or the corresponding circuit 221 exposed, but also at the same time the bottom 251 may further enter part of the non-conductive carrier 240. Please refer to the first embodiment for the other steps of the third embodiment to form the conductive layer, the solder mask and the solder.

Fourth Embodiment

Figure 7D:
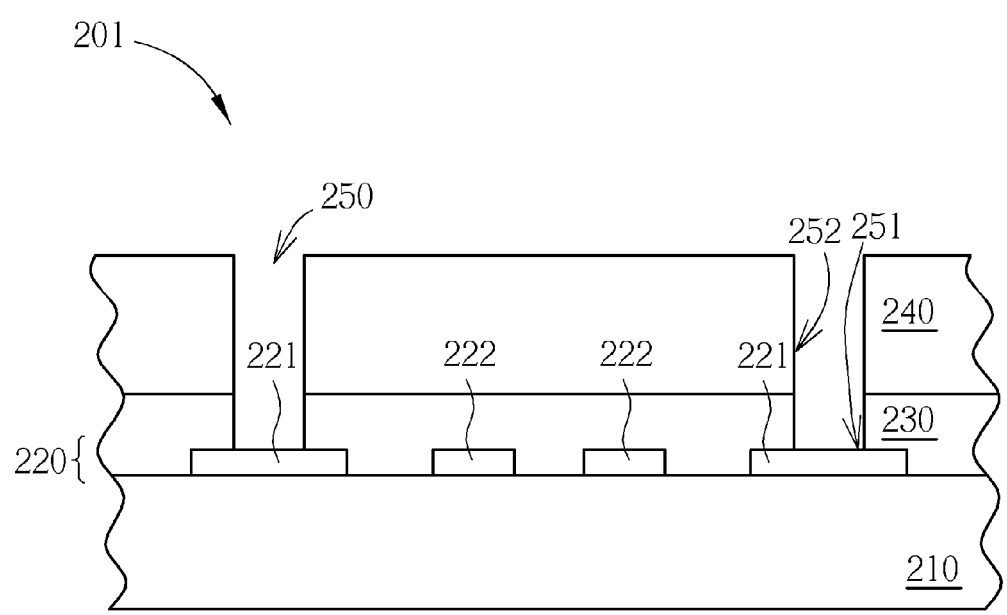

Please refer to FIG. 7D, illustrating another example to remove some of the multilayer structure 201 from the non-conductive carrier 240 side to form the notch 250. The notch 250 has a substantially vertical sidewall 252, for example the notch 250 includes a bottom 251 and a sidewall 252. In this fourth embodiment, the notch 250 which starts downwards from the top surface of the non-conductive carrier 240 penetrates the non-conductive carrier 240 and the passivation layer 230 at the same time to make the passive element 222 or the corresponding circuit 221 exposed. Similarly, the thickness of the non-conductive carrier 240 may be optionally and suitably reduced to about 100 μm for example in advance before the notch 250 is formed. Please refer to the first embodiment for the other steps of the fourth embodiment to form the conductive layer, the solder mask and the solder.

Fifth Embodiment

Figure 7E:
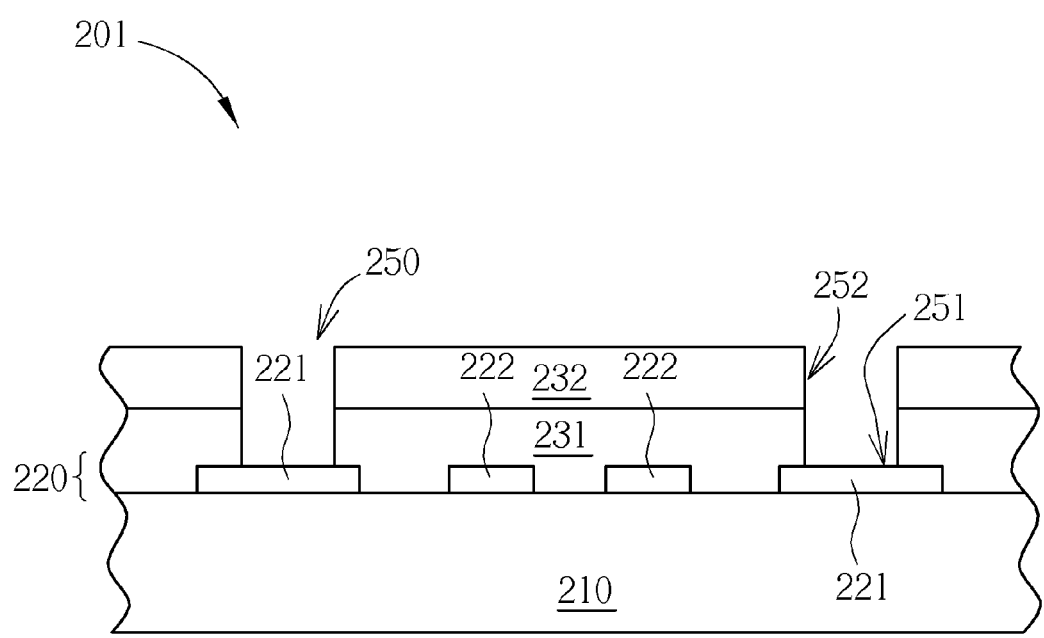

Please refer to FIG. 7E, illustrating another example to remove some of the multilayer structure 201 to form the notch 250. In this fifth embodiment, there is no non-conductive carrier to be formed as described earlier but a passivation layer of composite structure is formed instead. For example, a second passivation layer 232 is formed on top of a first passivation layer 231. Optionally, the first passivation layer 231 may be patterned in advance before the second passivation layer 232 is formed. The second passivation layer 232 may include polyimide.

Next, the notch 250 which starts downwards from the second passivation layer 232 side is formed. The notch 250 has a substantially vertical sidewall 252, for example the notch 250 includes a bottom 251 and a sidewall 252. In this embodiment, the notch 250 penetrates the first passivation layer 231 and the second passivation layer 232 at the same time to make the passive element 222 or the corresponding circuit 221 in the multilayer structure 201 exposed. Please refer to the first embodiment for the other steps of the fifth embodiment to form the conductive layer, the solder mask and the solder.

After the previous steps, the package-ready multilayer structure 201 is obtained. Next, a subsequent dicing procedure, for example traditional processing procedures such as etching or mechanical methods is carried out through the notch 250 in the aligned and package-ready multilayer structure 201 or through the edges of the notch 250 to obtain multiple packaged multilayer structure 202 in single pieces, an integrated passive device (IPD) for instance. Optionally, the non-conductive carrier 240 may be removed after the subsequent dicing procedure is completed. FIGS. 11A, 11B, 11C 11D and 11E each illustrates the results of the above-mentioned first embodiment, second embodiment, third embodiment, fourth embodiment and fifth embodiment after the dicing procedure is completed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure, comprising:
    a non-conductive substrate having an upper surface and a lower surface;
    a conductive element disposed on said upper surface of said non-conductive substrate and substantially consisting of a passive element and a corresponding circuit;
    a passivation layer completely covering said conductive element and said non-conductive substrate so that said conductive element is sandwiched between said passivation layer and said non-conductive substrate;
    a jointed side positioned on said lower surface and extending to said upper surface to expose at least one of said passive element and said corresponding circuit;
    a conductive layer covering said jointed side, extending beyond said jointed side and electrically connected to at least one of said passive element and said corresponding circuit;

a solder disposed outside said jointed side and directly electrically connected to said conductive layer; and a solder mask completely covering said jointed side and said conductive layer and selectively exposing said solder, wherein said non-conductive substrate is sandwiched between said conductive element and said solder mask.

2. The package structure of claim 1, wherein said jointed side exposes said passivation layer.

3. The package structure of claim 1, wherein said passive element is an integrated passive device (IPD).

4. The package structure of claim 1, wherein said jointed side exposes said non-conductive substrate.

5. The package structure of claim 1, further comprising: a non-conductive carrier completely covering said passivation layer without contacting said conductive element.

6. The package structure of claim 5, wherein said jointed side exposes said non-conductive substrate, said passivation layer and said non-conductive carrier.

7. The package structure of claim 5, wherein said jointed side exposes said non-conductive carrier.

8. The package structure of claim 5, wherein said jointed side exposes said non-conductive carrier and said passivation layer.

9. The package structure of claim 5, wherein said jointed side exposes said non-conductive carrier, said passivation layer and said non-conductive substrate.

10. The package structure of claim 1, wherein said jointed side has a tapered sidewall.

11. A method for forming a package structure, comprising:
providing a multilayer structure comprising a non-conductive substrate and a passivation layer, wherein said non-conductive substrate has an upper surface and a lower surface, a conductive element is sandwiched between said non-conductive substrate and said passivation layer, wherein said conductive element is disposed on said upper surface and substantially consists of a passive element and a corresponding circuit;
forming a notch penetrating said non-conductive substrate from said lower surface to said upper surface so that said notch exposes at least one of said passive element and said corresponding circuit;
forming a conductive layer to cover said notch, to electrically connect at least one of said passive element and said corresponding circuit and to extend beyond said notch;
forming a solder mask to completely fill up said notch and selectively expose said conductive layer, wherein said non-conductive substrate is sandwiched between said conductive element and said solder mask; and forming a solder disposed outside said notch and directly electrically connected to said exposed conductive layer.

12. The method for forming a package structure of claim 11, wherein the bottom of said notch further enters said passivation layer.

13. The method for forming a package structure of claim 11, further comprising: providing a non-conductive carrier to completely cover said passivation layer without contacting said conductive element.

14. The method for forming a package structure of claim 13, wherein said notch is formed to penetrate said non-conductive substrate and said passivation layer and to partially enter said non-conductive carrier.

15. The method for forming a package structure of claim 13, wherein said notch is formed to exclusively penetrate said non-conductive carrier.

16. The method for forming a package structure of claim 13, wherein said notch is formed to penetrate said non-conductive carrier and to enter said passivation layer.

17. The method for forming a package structure of claim 13, wherein said notch is formed to penetrate said non-conductive carrier and said passivation layer and to partially enter said non-conductive substrate.

18. The method for forming a package structure of claim 11, wherein said notch penetrates said passivation layer and exposes said corresponding circuit.

19. A method for forming a package structure comprising:
providing a multilayer structure comprising a non-conductive substrate and a passivation layer so that a conductive element is sandwiched between said non-conductive substrate and said passivation layer, wherein said conductive element is disposed on a surface of said non-conductive substrate and substantially consists of a passive element and a corresponding circuit;
forming a notch so that the bottom of said notch exposes at least one of said passive element and said corresponding circuit;
forming a conductive layer to cover said notch, to electrically connect at least one of said passive element and said corresponding circuit and to extend beyond said notch;
forming a solder mask to completely fill up said notch and selectively expose said conductive layer;
forming a solder disposed outside said notch and directly electrically connected to said exposed conductive layer; and
dicing said package structure through said notch.

* * * * *